United States Patent [19]

Oldach

[11] Patent Number: 4,845,438
[45] Date of Patent: Jul. 4, 1989

[54] PHASE COMPARISON CIRCUIT

[75] Inventor: Detlef W. K. Oldach, Hamburg, Fed. Rep. of Germany

[73] Assignee: U.S. Philips Corporation, New York, N.Y.

[21] Appl. No.: 172,999

[22] Filed: Mar. 23, 1988

Related U.S. Application Data

[63] Continuation of Ser. No. 780,361, Sep. 26, 1985, abandoned.

[30] Foreign Application Priority Data

Oct. 3, 1984 [DE] Fed. Rep. of Germany ....... 3436192

[51] Int. Cl.$^4$ .................. H03D 13/00; H03K 9/06
[52] U.S. Cl. .................. 328/133; 328/134; 328/109; 307/511; 307/262
[58] Field of Search .................. 328/133, 134, 109; 307/511, 514, 510, 262; 329/137; 375/118

[56] References Cited

U.S. PATENT DOCUMENTS

| | | | |
|---|---|---|---|
| 3,577,088 | 5/1971 | Goggins, Jr. | 328/134 |
| 3,944,938 | 3/1976 | Brouant | 329/50 |
| 4,281,259 | 7/1981 | Ozawa | 307/514 |

FOREIGN PATENT DOCUMENTS 3310581 9/1984 Fed. Rep. of Germany.

Primary Examiner—Stanley D. Miller
Assistant Examiner—Richard Roseen
Attorney, Agent, or Firm—Michael E. Marion

[57] ABSTRACT

The invention relates to a phase comparison circuit for determining the phase deviation between an input signal and a reference signal. The input signal is integrated during two consecutive defined integration intervals which are derived from the reference signal. The integral values assigned to the integration intervals are weighted and the difference is formed. The output signal of the phase comparison circuit is derived from the result of forming this difference.

12 Claims, 3 Drawing Sheets

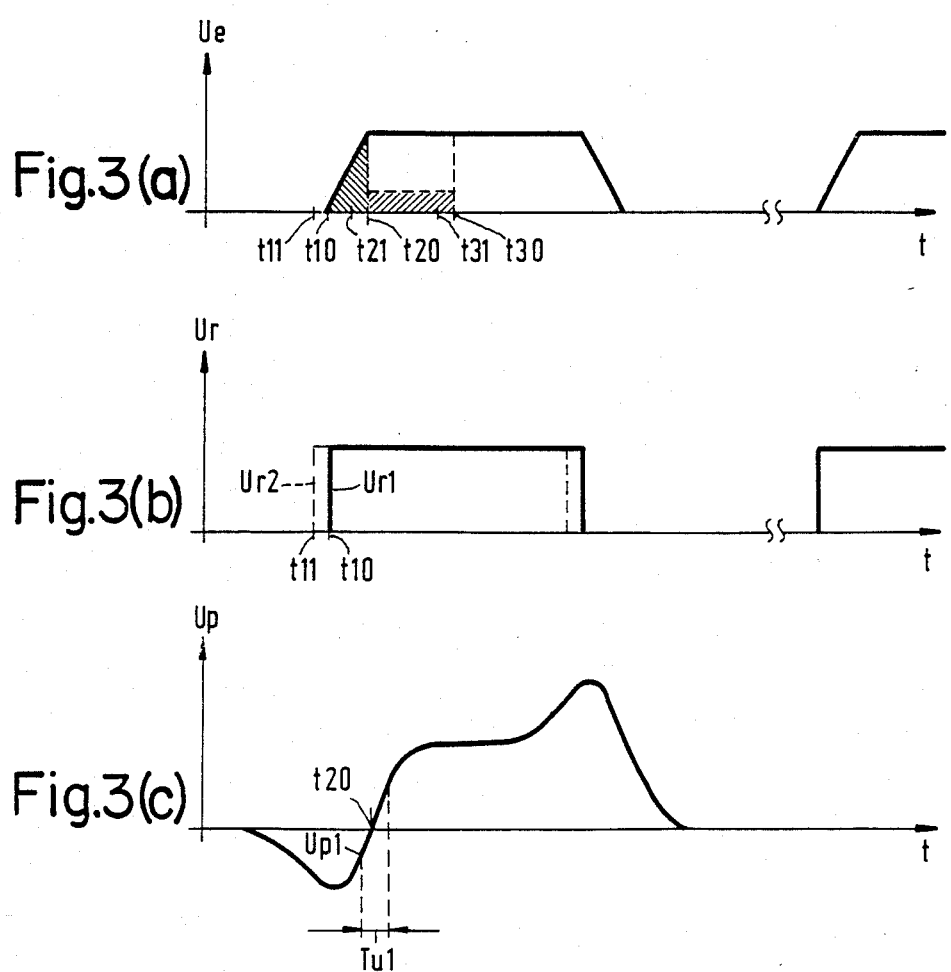

PHASE COMPARISON CIRCUIT

This is a continuation of application Ser. No. 780,361 filed Sept. 26, 1985 now abandoned.

The invention relates to a circuit arrangement for detecting the phase deviation between an input signal and a reference signal, which produces an output signal which depends on said deviation by integrating the input signal during an integration interval which is in synchronism with the reference signal.

Such a circuit arrangement is described in the German periodical "Funkschau", 1976, volume 7, Page 258. Such a circuit arrangement can be used in phase control circuits which so control the phase and frequency of an oscillator that its phase corresponds to the phase of a reference signal. This prior art circuit arrangement compares a phase of a sinusoidal input signal, that is to say a signal which is symmetrical with respect to the zero line, and the phase of a pulse-shaped reference signal. During a time interval which is in synchronism with the pulse-shaped reference signal the phase comparison circuit supplies an output signal which is proportional to the symmetrical input signal and is integrated by a subsequent low-pass filter. In the target phase position, that is to say when no phase deviation is present, the output signal of the low-pass filter is zero, because the integration interval is then located such that a portion of the symmetrical input signal is integrated before the zero crossing and a subsequent portion of equal duration is integrated after the zero crossing. Consequently, this phase comparison circuit cannot process input signals which are not symmetrical relative to the zero line.

SUMMARY OF THE INVENTION

The invention has for its object to provide a phase comparison circuit and which is of such a construction that it can process input signals, which are not symmetrical to the zero line, more specifically which are pulse-shaped. To that end the circuit arrangement is characterized in that it comprises an integrator arrangement for integrating the input signal during two consecutive defined integration intervals and a superposition circuit for forming a signal which corresponds to the difference between weighted integral values produced at the integrator arrangement. The weighting factors and/or the duration of the integration intervals, respectively, deviate from each other.

In the circuit arrangement according to the invention the integration intervals must not, in contrast to the prior art circuit arrangement, by symmetrical to the zero line of the input signal. The two integration intervals may have different durations and they may follow each other directly or at a determined time interval. The integration results are weighted such that for a defined phase difference the output signal of the phase comparison circuit is zero. Consequently, the weighting and superposition operations correspond to forming the difference between the two integration results. For the pulse-shaped input signals the first integration interval is advantageously located within the rise time and the second integration interval within the pulse top of the pulse-shaped input signal. It is advantageous to choose long integration intervals, as then interferences, if any, get lower values. On the other hand these integration intervals must not be too long, as then the linearity of the phase comparison circuit decreases.

A first further development of the invention provides a multiplexer with an input for receiving the inverted input signal and another input for receiving the non-inverted input signal. The integrator arrangement comprises an integrator whose input is connected to the output of the multiplexer. A timing device is controlled by the reference signal which is provided for setting the integrator into operation during the integration interval and for switching the multiplexer between the time intervals. The integrator output constitutes the output of the circuit arrangement.

It is particularly advantageous in the circuit arrangement that the two integrations can be effected in one integrator and superpositioning occurs simultaneously in this integrator. Weighting of the input signal is effected by the integrator and the superposition is realised by an adder, as during an integration interval the input signal is applied in the inverted form.

A second further development of the invention provides that the integrator arrangement comprises two integrators at whose inputs the input signal is present. A timing device controlled by the reference signal is provided for setting one integrator into operation during the first time interval and the other integrator during the second time interval. The weighted output signals of the two integrators are applied to inputs of the superposition circuit and the output of the circuit arrangement is coupled to the output of the superposition circuit.

In this circuit arrangement the dependence of the output signal on the amplitude of the input signal for the case in which the second integration interval always coincides with the pulse tops of the input signal can be eliminated by providing a divider circuit for dividing the output signal of the superposition circuit by the output signal of the integrator which is set into operation during the second integration interval.

For the above-described embodiments of the invention analog signal processing is possible. It is, however, advantageous to use digital signal processing in which the input signal is available as a sequence of digitized sampling values in binary representation, which digital signal processing is characterized in that the input signal is applied via an analog/digital converter whose sampling frequency is in integral multiple of the frequency of the reference pulse. The integrator or integrators are controlled by the timing device such that a fixed number of sampling values of the input signal are always integrated. Then a digital circuit arrangement can also be constructed in the analog form at less cost and design effort and can furthermore be realised in a simple way using an integrated circuit which enables detection of phase deviations which are significantly less than a sampling value.

Further advantages and improvements of the invention will now be described in greater detail by way of example with reference to the accompanying drawings.

BRIEF DESCRIPTION OF THE FIGURES

FIGS. 3(a), 3(b) and 3(c) show time diagrams of the signals shown in FIG. 2.

DESCRIPTION OF THE PREFERRED EMBODIMENT

Figure 1:
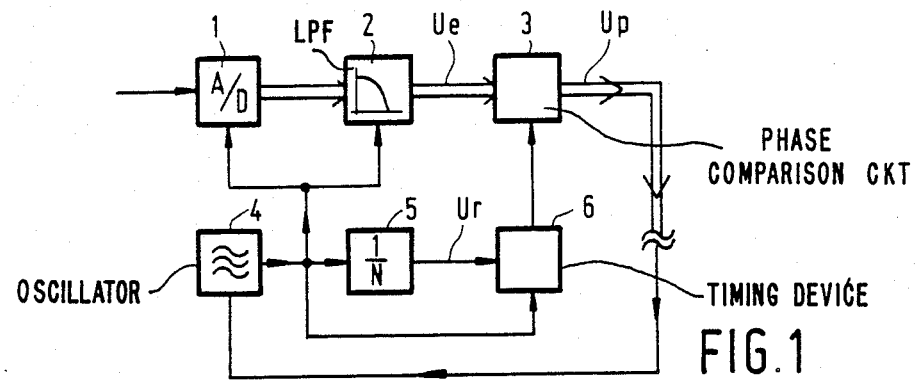
FIG. 1 is a circuit diagram of a phase control loop comprising a phase comparison circuit for digital signal processing.

A positive analog pulse-shaped input signal, for example line synchronizing pulses of a television signal are digitized with the aid of an analog/digital converter 1 and further processed in a digital low-pass filter 2. The low-pass filter which has a cut-off frequency of 1 MHz improves the signal-to-noise ratio and has for its effect that the output signal of the low-pass filter has a defined rising edge. The output signal of the digital low-pass filter 2 is an input signal Ue of a phase comparison circuit 3. An oscillator 4 produces a clock signal with a frequency of 13.5 MHz. The clock signal is applied to the analog/digital converter 1, to the low-pass filter 2 and to a frequency divider 5. The output signal of the frequency divider 5 is an analog pulse-shaped reference signal having a frequency of 15.625 kHz (i.e. the 864$^{th}$ part of the sampling frequency). The reference signal Ur is applied to one input and the clock signal to the other input of a timing device 6. The timing device 6 applies to the phase comparison circuit 3 control signals whose time positions depend on the zero crossing of the pulse-shaped reference signal Ur. The digital output signal Up of the phase comparison circuit is fed back to the oscillator 4. The digital output signal Up may be applied to the oscillator 4, for example via a digital-/analog converter, not shown. The frequency of the oscillator 4 is changed using the analog output signal of the digital/analog converter, and the frequency and phase of the reference signal Ur are matched to the frequency and phase of the input signal.

Figure 2:
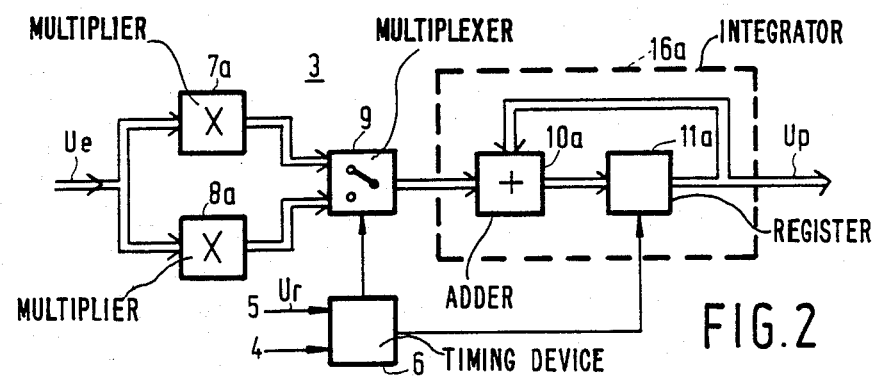
FIG. 2 shows a portion of FIG. 1 with a first embodiment of the phase comparison circuit.

FIG. 2 shows a first embodiment of the phase comparison circuit. The digital pulse-shaped input signal Ue is applied to the two inputs of a multiplexer 9 via two multipliers 7a and 8a. The multiplier 7a multiplies the input signal by a factor of 4 and the multiplier of 8a by a factor −1. The multiplier 7a may, for example, be constituted by a shift stage and the multiplier 8a by NAND-gates. The multiplexer 9 is followed by an integrator 16a.

This integrator 16a comprises an adder 10a and a register 11a. The input signal of the integrator 16a is applied to the adder 10a and the output signal of the adder 10a is applied to the register 11a. The output signal of the register 11a, which also constitutes the output signal of the integrator 16a and of the phase comparison circuit is fed back to the adder 10a. The timing device 6 which may, for example, include counters, is connected to the multiplexer 9 and to the register 11a. The counters are started by the leading edges of the pulse-shaped reference signal Ur. The counters determine the number of clock signals applied to the register 11a and the number of clock pulses after which the multiplexer 9 is switched by a signal from the timing devices 6.

FIGS. 3(a), 3(b) and 3(c) further explain the mode of operation of the circuit arrangement shown in FIG. 2. Diagram a shows the input signal Ue of the phase comparison circuit. The signal is represented by a continuous curve by way of illustration. Diagram b shows two pulse-shaped reference signals, reference signal Ur1 having the target phase position and the reference signal Ur2 for illustration purposes, which represents a supposed reference signal having a phase position different from reference signal Ur1. The mode of operation of the circuit with the target phase position will now be described first. At an instant T10, the beginning of the first integration interval the leading edge of the reference signal Ur1 so controls the timing device 6, that the register 11a is set to zero and is enabled and the multiplexer 9 is switched such that the input signal multiplied by the multiplier 7a by the factor of 4 is applied to the adder 10a. The sampling value of the input signal multiplied by 4 is stored in the register 11a and added to the second sampling value at the second clock signal. The result of this addition is also stored in register 11a. The individual sampling values are further added together at each clock signal.

The first integration interval ends and the second integration interval begins, at an instant t20 and the timing device 6 switches the multiplexer 9, so that the input signal multiplied by the multiplier 8a by the factor −1 is applied to the adder 10a. The negative sampling values are added to the result of the adding operation effected in the first integration interval. At an instant t30, at the end of the second integration interval, which is twice as long as the first integration interval, the timing device 6 disables the register 11a, and the output signal Up has zero value for the target phase position. This result is once again illustrated by comparing the two areas with different markings in FIG. 3(a). They have the same values for the target phase position. By way of illustration, the area in the second integration interval is reduced by a factor of 4, as multiplication by this factor was effected during the first integration interval.

It will also be apparent that in the target phase position the first integration interval coincides with the rising edge of the pulse-shaped input signal and that the second integration interval coincides with the pulse top of the pulse-shaped input signal. It is alternatively possible to opt for a shorter duration for the first integration interval and to have it start at a later instant, and to choose the second integration interval to be shorter or longer and to have it start at a later instant. If for both signals the same target phase position as in the foregoing occur, then, if the integration intervals are changed, the factors of the multipliers 7a and 8a must possibly be changed. If the two integration intervals are given the same durations, then the weighting factors must have different values, or when the weighting factors are given the same values, then the integration intervals must have different durations.

As FIG. 3(b) shows, the reference signal Ur2 deviates from the target phase position of the reference signal Ur1. The first integration interval starts at an instant t11 and ends at an instant t21 (FIG. 3a). The second integration interval starts at an instant t21 and ends at instant t31 (FIG. 3a). After the integration has ended, a negative output signal is obtained at the output of the phase comparison circuit. The phase comparison circuit characteristic shown in FIG. 3(c) shows the output signal Up in dependence on the change-over instant. The change-over instants are always the respective ends of the first integration intervals. The negative output signal dependent on reference signal Ur2 is designated in the characteristic by Up1. In the range specified on the abcissa of the characteristic by Tu1 the output signal is substantially proportional to the phase deviation between the pulse-shaped input signal and the reference signal.

Figure 4:
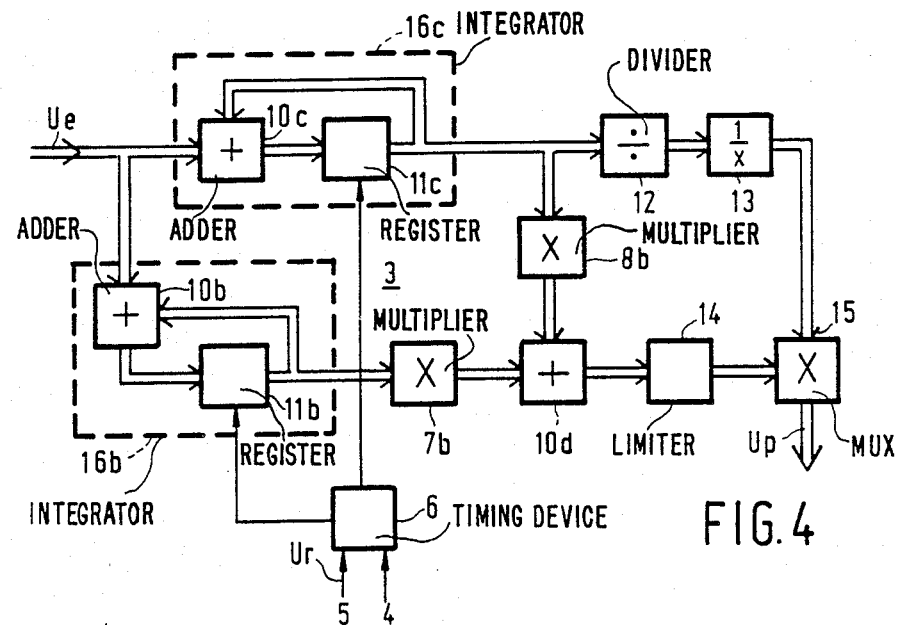
FIG. 4 shows a portion of FIG. 1 with a second embodiment of the phase comparison circuit.

FIG. 4 shows a second embodiment. The digital pulse-shaped input signal Ue is applied to two integrators 16b and 16c which are of a similar construction as integrator 16a. The registers 11b and 11c of the two integrators are connected to the timing device 6. The output signal of the first integrator 16b is multiplied by a multiplier 7b by a factor of 4 and the output signal of the second integrator 16c is multiplied by a multiplier 8b by a factor −1. Subsequent thereto the two output signals of the multipliers 7b and 8b are superimposed in an adder 10d. The output signal of the second integrator 16c is applied to a divider circuit 12 and a circuit 13 for producing the reciprocal value. The output signal of the adder 10d is applied to an overflow limiter 14. In a multiplier 15 the output signal of the overflow limiter 14 and the output signal of the circuit 13 are multiplied to form the reciprocal value. The overflow limiter 14 has for its object to limit the output signal of the adder 10d apart from a predetermined value. This reduces the cost and design effort for the multiplier 15, as it has only to be designed for the maximum value of the output signal of the overflow limiter 14.

Figure 5A:
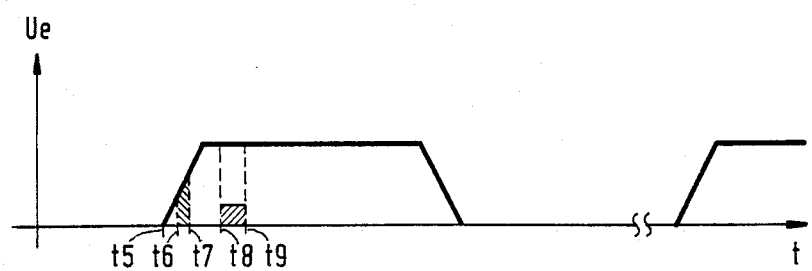
FIGS. 5(a), 5(b) and 5(c) show the time diagrams of the signal shown in FIG. 4.
Figure 5B:
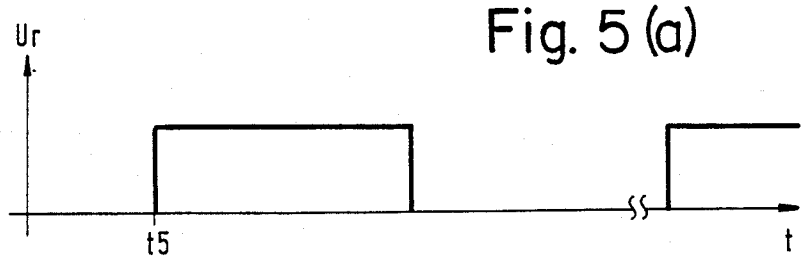
Figure 5C:
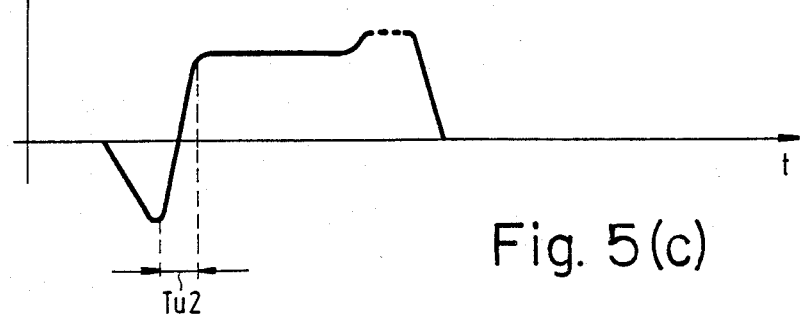

FIGS. 5(a), 5(b) and 5(c) illustrate the mode of operation of the circuit arrangement of FIG. 4. Diagram a again shows the input signal Ue, diagram b shows the reference signal Ur and diagram c the characteristic of the phase comparison circuit. The mode of operation of the circuit here described is based on the target phase position. At an instant t5 the timing device 6 is controlled such by the leading edge of the pulse-shaped reference signal Ur, that at an instant t6 at the beginning of the first integration interval, the register 11b is enabled and the first integrator 16b is consequently put into operation. The integrator 16b adds together the sampling values of the pulse-shaped input signal of the first integration interval. At an instant t7 the first integration interval has ended, and register 11b is disabled. The second integration interval starts at an instant t8. The register 11c is enabled by the timing device 6 and the second integrator 16c which adds together the sampling values of the second integration interval is put into operation. The second integration interval ends at an instant t9, and register 11c is disabled. The integration result of the second integrator 16c is applied to the adder 10d via the multiplier 8b and the integration result of the first integration interval stored in register 11b is applied to the adder 10d via the multiplier 7b. In the target phase position the output signal of the adder 10d is zero. This result is illustrated in FIG. 5(a), and also in FIG. 3(a). by comparing the areas with different markings.

As can be seen from FIG. 3(c) the output signal Up in the range designated as Tu1 on the abcissa of the characteristic of the phase comparison circuit is substantially proportional to the phase deviation between the reference signal and the pulse-shaped input signal. As however the output signal Up also depends on the amplitude level of the input signal, a standardization circuit is provided. This circuit is formed by the dividing circuit 12, the circuit 13 for forming the reciprocal value and the multiplexer 15. The integration result stored in the register 11c of the integrator 16c is divided in the divider circuit 12 by the number of sampling values of the second integration interval. The output signal of the overflow limiter 14 is multiplied by the reciprocal value of the output signal of the divider circuit 12, and the standardized output signal of the phase comparison circuit is obtained at the output of the multiplier 15.

The characteristic of this phase comparison circuit of FIG. 4 is shown in FIG. 5(c). The change-over instants are always the respective ends of the first integration interval. The range of the characteristic in which the overflow limiter is active, is illustrated by a broken-line curve. The linear range of this characteristic, designated by Tu2 on the abcissa, is increased because of the fact that shorter integration intervals are chosen. The duration of the integration intervals consequently affects the linearity of the characteristic of the phase comparison circuit. If the integration intervals are shortened, then also the sensitivity to noise of the phase comparator circuit changes, as individual noise components are rated higher.

The sensitivity of the phase comparison circuit does not only depend on the duration of the integration intervals, but also on the number of quantization steps of the line synchronizing pulses. The circuit is capable of detecting phase deviations between the reference signal and the line synchronizing pulses with a sensitivity of less than one clock signal—theoretically up to 1/M clock signals—, where M is the number of quantization steps. This however applies only when the line synchronizing pulses have rising edges with non-infinite slope as the duration of the first integration interval is less than or equal to the rise time of the line synchronizing pulses. This is ensured by the digital low-pass filter 2. When the line synchronizing pulses in the case of a 7-bit resolution of the television-signal comprise 40 quantization steps, then phase deviations of not more than 0.025 clock signals can be detected.

The circuit arrangement according to the invention is particularly suitable for a very accurate detection of phase deviations, it has however only a narrow linear range of characteristics (operating range). By combining the circuit arrangement with a phase comparison circuit having a larger linear range of characteristics, but a lower sensitivity, the invention can be advantageously utilized. The low-sensitivity phase comparison circuit first controls the phase position between the input and reference signals (coarse control). If the phase deviation is located within the operating range of the circuit arrangement according to the invention, the circuit arrangement takes over the further control (fine control).

What is claimed is:
1. A circuit for detecting phase deviation between an input signal and a reference signal comprising:
   timing means for generating two consecutive time intervals which define different first and second integration intervals which are synchronized with a reference signal said first integration level being shorter than or equal to a rise time of the input signal;
   an integrator for integrating the input signal during the two consecutive defined integration intervals which differ in duration and which are synchronized with said reference signal, producing first and second output signals which are weighted by different weighting factors during respective integration intervals; and
   a superposition circuit connected to receive said first and second output signals which are weighted, and which provides an output signal corresponding to the difference between said first and second weighted output signals.
2. A circuit as claimed in claim 1, wherein, prior to being applied to said integrator, the input signal is applied to an analog-digital converter whose sampling frequency is an integral multiple of the frequency of the reference signal, the integrator being controlled by the timing means such that a fixed number of sampling values of the input signal is always integrated.

3. A circuit as claimed in claim 2, wherein the the output of said analog-digital converter is filtered by a low-pass filter prior to being applied to said integrator.

4. A circuit arrangement as claimed in claim 1, further comprising a multiplexer with an input for receiving an inverted input signal and another input for receiving a non-inverted input signal, the integrator having an input connected to the output of the multiplexer, the timing means controlled by a reference signal enabling the integrator during each integration interval, and switching the multiplexer between the integration intervals.

5. A circuit arrangement as claimed in claim 1, wherein the circuit comprises two integrators whose inputs receive the input signal, the timing means controlled by the reference signal setting one integrator into operation during the first time interval and the other integrator during the second time interval, to produce first and second weighted output signals, the weighted output signals of the the integrators being applied to inputs of the superposition circuit.

6. A circuit as claimed in claim 1, wherein the first integration interval is shorter than or equal to a rise time of the input signal, and wherein the two integration intervals are spaced from each other such that at a defined phase difference, the first integration interval coincides with the rising edge of the input signal and the second integration interval coincides with the pulse top of the input signal, and wherein the durations of the two integration intervals and the weighting factors are chosen such that the output signal has a defined value for said defined phase difference.

7. A circuit as claimed in claim 5, further comprising a divider circuit for dividing the output signal of the integrator which is enabled during the second integration interval.

8. A circuit as claimed in claim 3, wherein the superposition circuit is followed by a limiter circuit.

9. A circuit for detecting phase deviations between an input signal and a reference signal comprising:
 a first multiplier for receiving said input signal and multiplying said input signal by a factor;
 a second multiplier for receiving said input signal, and multiplying said input signal by a factor different from said first multiplier factor;
 a multiplexer having first and second inputs connected to receive a signal from each of said first and second multiplexers;
 an integrator circuit connected to receive a signal from said multiplexer, and which adds first and second signal samples received from said multiplexer; and
 a timing generator for controlling said multiplexer to produce first and second sample intervals of each multiplier output signal, said timing generator synchronized with said reference signal, said sample intervals selected to be of different duration so that said integrator produces a zero value signal when said input signal and reference signal have a target phase position with respect to each other.

10. The timing generator of claim 9 wherein said first and second multipliers have a factor of $-1$ and 4, respectively.

11. A circuit for detecting phase deviations between an input signal and a reference signal comprising:
 a first integrator connected to receive said input signal;
 a second integrator connected to receive said input signal;
 a first multiplier connected to receive a first integrated signal from said first integrator;
 a second multiplier connected to receive a second integrated signal from said second integrator, having a multiplication factor different from a multiplication factor of said first integrator;
 an adder for combining first and second signals received from said first and second multipliers; and
 a timing generator means connected to alternately enable said first and second integrators for first and second different time intervals in synchronization with said reference signal, whereby a signal is produced representing the phase difference between said input signal and reference signal.

12. The circuit of claim 11 further comprising:
 a divider connected to receive a signal from said first integrator;
 a reciprocal circuit for generating a signal which is the reciprocal of a signal from said divider;
 a limiter circuit connected to receive a signal from said adder; and
 a multiplexer connected to receive a signal from said limiter circuit and from said reciprocal circuit producing a signal which is the multiple of said limiter signal and said reciprocal circuit signal.

* * * * *